United States Patent [19]

Wang et al.

[11] Patent Number: 5,548,684
[45] Date of Patent: Aug. 20, 1996

[54] ARTIFICIAL NEURAL NETWORK VITERBI DECODING SYSTEM AND METHOD

[75] Inventors: Xiao-an Wang, Atlanta, Ga.; Stephen B. Wicker, Metz, France

[73] Assignee: Georgia Tech Research Corporation, Atlanta, Ga.

[21] Appl. No.: 232,812

[22] Filed: Apr. 22, 1994

[51] Int. Cl.$^6$ .................................................. G06E 1/00
[52] U.S. Cl. .................................. 395/21; 371/43; 395/22; 395/2.51
[58] Field of Search ............................ 395/21, 22, 2.51; 371/43

[56] References Cited

U.S. PATENT DOCUMENTS

| | | | |
|---|---|---|---|
| 3,789,360 | 1/1974 | Clark, Jr. et al. | 340/146.1 |
| 4,015,238 | 3/1977 | Davis | 340/146.1 |
| 4,087,787 | 5/1978 | Acampora | 340/146.1 |
| 4,730,322 | 3/1988 | Pollara-Bozzola | 371/43 |
| 4,885,757 | 12/1989 | Provence | 375/96 |
| 5,103,488 | 4/1992 | Gemello et al. | 382/22 |
| 5,375,129 | 12/1994 | Cooper | 371/43 |
| 5,381,513 | 1/1995 | Tsuboka | 395/2.41 |
| 5,461,696 | 10/1995 | Frank et al. | 395/2.41 |
| 5,465,321 | 11/1995 | Smyth | 395/22 |
| 5,487,117 | 1/1996 | Burges et al. | 382/173 |

OTHER PUBLICATIONS

Aiyar, S. et al, "A Hopfield Network . . . ," Neural Networks Conf., 1991, pp. II–827–32.

Pfeiffer, G., "Maximum Likelihood . . . ," Neural Networks Conf., 93, pp. 169095.

Mak, S. et al, "Soft–Decision Decoding . . . ," Globecom '93, pp. 9971–74.

Yu–Jhih Wu, et al., "Dynamic Adaptation of Quantization Threshold for Soft–Decision Viterbi Decoding with a Reinforcement Learning Neural Network," Journal of Signal Processing, 6, pp. 77–84 (1993).

M. Hussain, et al., "Reed–Solomon encoder/decoder application using a neural network," SPIE vol. 1469 Applications of Artificial Neural Networks II, pp. 463–471 (1991).

S. B. Wicker, Error Control Systems for Digital Communication and Storage, Chapter 11, Englewood Cliffs: Prentice Hall, 1994.

R. P. Lippman, "An Introduction to Computing With Neural Nets," IEEE ASSP Magazine, pp. 4–22, Apr. 1987.

Caid et al., "Neural Network Error Corecting Decoders for Block and Convolutional Codes," Globecom '90 IEEE Global Telecommunications Conference and Exhibition, vol. 2, pp. 1028–1031, Dec. 1990.

Alston et al., "A Neural Network Architecture for The Decoding of Long Constraint Length Convolutional Codes," 1990 International Joint Conference on Neural Networks—IJCNN 90, pp. 121–126, Jun. 1990.

(List continued on next page.)

*Primary Examiner*—Robert W. Downs
*Assistant Examiner*—A. Katbab
*Attorney, Agent, or Firm*—Hopkins & Thomas; Scott A. Horstemeyer

[57] ABSTRACT

An artificial neural network (ANN) decoding system decodes a convolutionally-encoded data stream at high speed and with high efficiency. The ANN decoding system implements the Viterbi algorithm and is significantly faster than comparable digital-only designs due to its fully parallel architecture. Several modifications to the fully analog system are described, including an analog/digital hybrid design that results in an extremely fast and efficient Viterbi decoding system. A complexity and analysis shows that the modified ANN decoding system is much simpler and easier to implement than its fully digital counterpart. The structure of the ANN decoding system of the invention provides a natural fit for VLSI implementation. Simulation results show that the performance of the ANN decoding system exactly matches that of an ideal Viterbi decoding system.

19 Claims, 8 Drawing Sheets

OTHER PUBLICATIONS

Viterbi, "Error Bounds for Convolutional Codes and an Asymptotically Optimum Decoding Algorithm", IEEE Transactions on Information Theory, IT–13, pp. 260–269, Apr. 1967.

P. J. Black, et al., "Hybrid Survivor Path Architectures for Viterbi Decoders," Proceedings of ICASSP, IEEE International Conference on Acoustics, Speech and Signal Processing, pp. 433–436, vol. 1, Apr. 1993.

Paaske, et al., "An area–efficient path memory structure for VLSI implementation of high speed Viterbi decoders," Integration, the VLSI journal 12 (1991) pp. 79–91.

Yuan, et al., "Correlation decoding of the (24, 12) Golay code using neural networks," IEE Proceedings–1 vol. 138, No. 6, Dec. 1991, pp. 517–524.

Ma et al., "Decoding complement–closed codes with coordinate–disjoint decomposition," IEE Proceedings–I, vol. 139, No. 5, Oct. 1992, pp. 488–494.

Sparso, et al., "An Area–Efficient Topology for VLSI Implementation of Viterbi Decoders and Other Shuffle–Exchange Type Structures", 1991, IEEE Journal of Solid–State Circuits, vol. 26, No. 2, Feb. 1991, pp. 90–97.

Forney, Jr., "Convolutional Codes II. Maximum, Likelihood Decoding," Information and Control 25, pp. 222–266 (1974).

Dzung–ji lii, et al., "A New Model of Neural Networks for Error Correction," IEEE, Ninth Annual Conference of the Engineering in Medicine and Biology Society.

Hekstra, "An Alternative to Metric Rescaling in Viterbi Decoders," IEEE Transactions on Communications, vol. 37, No. 11, Nov. 1989, pp. 1220–1222.

ARTIFICIAL NEURAL NETWORK VITERBI DECODING SYSTEM AND METHOD

FIELD OF THE INVENTION

The present invention generally relates to coding systems and processes for error control in digital communications, and more particularly, to a system and method for high speed and efficient decoding of convolutionally-encoded data streams utilizing the Viterbi algorithm and an artificial neural network (ANN).

BACKGROUND OF THE INVENTION

A typical communications system 11 which utilizes convolutional coding for error control is illustrated in FIG. 1. At the transmitting end of the communications system 11, a data stream x (or digital information sequence; boldface text denotes a vector herein), as designated at reference arrow 12, is received and encoded by a convolutional encoding system 13 to form convolutional code words y, designated at reference arrow 14. The convolutional code words y are then transmitted across a communications channel 16, which is generally noisy. The noise corrupts the convolutional code words y, and corrupted vectors r are produced at reference arrow 17 at the receiving end of the communications system 11. At the receiving end, a convolutional decoding system 18 receives the vectors r and generates a convolutionally-decoded data stream x', as indicated at reference arrow 21, which is an estimate of the original data stream x.

Convolutional codes are well known in the art and were first presented in 1955. For a detailed discussion of convolutional coding, see S. B. Wicker, *Error Control Systems for Digital Communication and Storage*, Chapter 11, Englewood Cliffs: Prentice Hall, 1994, which is a textbook written by one of the inventors herein. In general, convolutional coding for error control involves introducing redundancy into a data stream through the use of memory elements, for example, a linear shift register or like apparatus, in order to determine and minimize error in a data transmission.

A typical convolutional encoding system 13 having a rate of ½ is shown in FIG. 2. The rate of this encoding system 13 is established by the fact that the encoding system 13 outputs 2 bits 22a, 22b, for every input bit 24. In general, an encoding system 13 with k inputs and n outputs is said to have rate k/n. In FIG. 2, the binary input data stream $x=(x_0,x_1,x_2,\ldots)$ is fed into a shift register 26 having a series of memory elements 28a, 28b. With each successive input 24 to the shift register 26, the values of the memory elements 28a, 28b are tapped off, as indicated by reference arrows in FIG. 2, and added via adders 32, 34 according to a fixed pattern. This operation creates a pair of outputs 22a, 22b, which are essentially coded data stream $y^{(0)}=(y_0^{(0)},y_1^{(0)},y_2^{(0)},\ldots)$ and $y^{(1)}=(y_0^{(1)},y_1^{(1)},y_2^{(1)},\ldots)$. These output data streams 22a, 22b are typically multiplexed together to create a single coded data stream $y=(y_0^{(0)},y_0^{(1)},y_1^{(0)},y_1^{(1)},y_2^{(0)},y_2^{(1)},\ldots)$, which is commonly referred to as a convolutional code word.

A trellis diagram 35 representative of the convolutional encoding system 13 is illustrated in FIG. 3. The concept of the trellis diagram is well known in the art and is utilized in order to analyze system state changes. In essence, a trellis diagram is a state diagram which explicitly shows passage of time. The memory elements 28a, 28b in the encoding system 13 of FIG. 1 can exhibit, at any given time, one of the states $S_0$, $S_1$, $S_2$, $S_3$, or 00, 10, 01, 11, respectively. The trellis diagram 35 of FIG. 3 shows all possible system states at the nodes of the diagram and shows all possible state transitions by the branches of the trellis diagram 35. The branches of the trellis diagram 35 are labelled with the output bits corresponding to the associated state transitions.

In general, encoding systems are simple to construct and implement. However, the difficulty in practicing convolutional coding in the communications system 11, as set forth in FIG. 1, involves the design of the convolutional decoding system 18. In recent years, efforts have been made to design convolutional decoding systems 18 which implement an artificial neural network (ANN). ANN's have been successfully applied in the fields of signal processing and pattern recognition. Although the general decoding problem can be viewed as a form of pattern recognition, it possesses some distinctive features that substantially complicate the design process. First, the information to be decoded in a single code word is far more extensive than that involved with the recognition of a pattern. For example, a typical pattern recognition problem might require the identification of one of eight patterns in a 12×10 binary image, as is described in R. P. Lippmann, "An Introduction to Computing with Neural Nets", *IEEE ASSP Magazine*, pages 4–22, April, 1987. This requires the consideration of 8 out of $2^{120}$ possibilities. In contrast, a rate –½ convolutional code has $2^{60}$ 120-bit code words that must be considered. Second, conventional pattern recognition problems have more arbitrary pattern distributions than decoding problems. In most cases, the code words form a vector space over a finite field. The algebraic properties of practical block codes and convolutional codes may introduce additional structure.

The foregoing features demand consideration in the implementation of ANN convolutional decoding systems 18. One may draw the following conclusions. First, network training is not likely to be a successful design tool. For neural nets to correctly create the decision regions for a large number of code words, a training set of equal extent is required, which results in impractically large training time (assuming that conversion will occur at all), storage space, and number of neurons. It is reported in W. R. Caid and R. W. Means, "Neural network error correcting decoders for block and convolution codes," *GLOBECOM '90 IEEE Global Telecommunications Conference and Exhibition*, vol. 2, pages 1028–1031, Dec. 1990, that the neural network decoding system with training is limited to very small codes like the Hamming code and convolutional codes with constraint lengths K less than or equal to 3. The constraint length K of a convolutional code is defined as the maximum number of bits in a single output stream that can be affected by any input bit. Second, the algebraic structure of the code words is not efficiently used in a trained ANN convolutional decoding system 18. For these reasons, the design of ANN convolutional decoding systems 18 has been a process of "neuralizing" the existing digital coding algorithms which have themselves been derived by fully exploiting the algebraic properties of the codes. The resulting ANN convolutional decoding systems 18 have thus been characterized by fixed-weight and training-free networks.

Having recounted the above issues, it should be noted that ANN decoding systems 18 exhibit important advantages over their digital counterparts. One advantage is that the decoding process can be maximally parallelized by an ANN, which greatly increases the decoding system throughput. Another advantage is that neural network convolutional decoding systems 18 can lead to simpler VLSI (Very-Large-Scale Integrated Circuit) realization, because neurons of a given type have identical characteristics, and most internodal connections have weights of either +1 or −1 and tend to run along very regular patterns.

Several ANN decoding systems have been developed for convolutional codes. See for example, the aforementioned by W. R. Caid and R. W. Means as well as M. D. Alston and P. M. Chau, "A neural network architecture for the decoding of long constraint length convolutional codes," 1990 *International Joint Conference on Neural Networks - IJCNN 90*, pages 121–126, June 1990. For convolutional codes, it is well known that the Viterbi algorithm provides maximum likelihood decoding and can be considered optimal. In this regard, see S. Wicker, *Error Control Systems for Digital Communication and Storage*, Englewood Cliffs: Prentice Hall, 1994, and A. J. Viterbi, "Error Bounds for Convolution Codes and an Asymptotically Optimum Decoding Algorithm," *IEEE Transactions on Information Theory*, IT-13, pages 260–269, April 1967.

In a decoding system for implementing the Viterbi algorithm., the decoding system is modelled around a trellis diagram, such as that shown in FIG. 3 for the encoding system 13 of FIG. 2. Each of the nodes in the trellis diagram, which represent states in the diagram, is assigned a number. The number is referred to as the partial path metric of a path which passes through that node. The assignment of numbers of the trellis nodes is routine until the point in the trellis where more than one path enters a node. In this case, the node label chosen is the "best" (largest or smallest) partial path metric among the metrics for all of the entering paths. The path with the best metric is the survivor, while the other entering paths are nonsurvivors. If the best metric is shared by more the one path, then the best path is chosen at random. The Viterbi algorithm terminates when all of the nodes in the trellis diagram have been labeled and their entering survivors determined. Then, the paths which survived are traced back from the last node in the trellis diagram to the first node. Because each node has only one entering survivor, the trace-back operation always yields a unique path, and the unique path yields the best approximation of the input data stream.

However, the ANN convolutional decoding systems 18 discussed in the literature to date are suboptimal. For example, the ANN convolutional decoding system 18 in the aforementioned Caid et al. article uses training to establish the coefficients for the Viterbi algorithm, and is thus limited to very small constraint codes ($K \leq 3$). In any case, it is outperformed by comparable digital implementations of the Viterbi algorithm. Moreover, the decoding system in the aforementioned Alston et al. article can deal with codes of long constraint length K, but also provides suboptimal performance. The Alston et al. decoding system allows for several possible decision rules, and the best one has not yet been found. Other work related to the Viterbi decoding system includes the neural network developed in Y. Wu et al., "Dynamic adaption of quantization threshold for soft-decision Viterbi decoding with a reinforcement learning neural network," *Journal of VLSI Signal Processing*, pages 77–84, Volume 6, No. 1, June 1993. This embodiment dynamically adjusts the soft quantization threshold, thus acting as a "coprocessor" for a conventional, digital implementation of a Viterbi decoding system.

There are many VLSI implementations of digital Viterbi decoding systems. As an example, see P. J. Black and T. Meng, "Hybrid survivor path architectures for Viterbi decoders," *Proceedings of ICASSP, IEEE International Conference on Acoustics, Speech and Signal Processing*, pages 433–436, Volume 1, April, 1993. The complexity of the digital designs governs the decoder throughput and chip size. However, these digital designs are inherently serial and complex, thus resulting in suboptimal performance and requiring an undesirable amount of chip space.

SUMMARY OF THE INVENTION

Therefore, an object of the present invention is to overcome the deficiencies and inadequacies of the prior art as noted above, and as generally known in the industry.

Another object of the present invention is to provide a decoding system and method for high speed decoding of convolutionally-encoded data streams.

Another object of the present invention is to provide a decoding system and method for efficient decoding of convolutionally-encoded data streams.

Another object of the present invention is to provide a decoding system and method for decoding of convolutionally-encoded data streams by implementing the well known Viterbi algorithm in an artificial neural network (ANN).

Another object of the present invention is to provide a decoding system for decoding convolutionally-encoded data streams which is simple in design, easy to manufacture, and reliable in operation.

Briefly described, the present invention provides for a decoding system for high speed and efficient decoding of convolutionally-encoded data streams utilizing an ANN implementation of the Viterbi algorithm. The system comprises an analog neural network having a plurality of analog neurons. The analog neurons are adapted to mathematically combine, particularly sum, analog input signals, which can exhibit any of numerous amplitude levels at an instance in time. The analog neural network is adapted to receive the convolutionally-encoded digital data stream and adapted to decode the data stream using the analog neurons into a convolutionally-decoded sequence of digital values by performing the Viterbi algorithm. Significantly, the analog neurons are used to process digital data which has been corrupted and/or attenuated by noise to achieve results efficiently at high speed with little space requirements.

In a first embodiment, the decoding system has the following elements. A correlation computation mechanism has first and second neurons, which emulate a decoding trellis. The first neurons receive the convolutionally-encoded data stream and generate branch metrics through a correlation computation. The second neurons mathematically sum the branch metrics from the first neurons with previous partial path metrics to derive current partial path metrics. A surviving path selection mechanism, which is in communication with the correlation computation mechanism, has third and fourth neurons. The third neurons identify surviving partial path metrics. The fourth neurons provide the surviving partial path metrics to the second neurons. The surviving partial path metrics are used by the second neurons as previous partial path metrics during a subsequent time increment. A maximum path metric selection mechanism, which is in communication with the surviving path selection mechanism, determines the identities of largest surviving partial path metrics. A register exchange mechanism, which is in communication with the surviving path selection mechanism, stores and updates the magnitudes of surviving partial path metrics. Finally, an output register selection mechanism, which is in communication with the maximum path metric selection mechanism and the register exchange mechanism, provides a convolutionally-decoded output data stream with digital values corresponding with the largest surviving partial path metrics.

In a second embodiment, the decoding system has the following elements. The maximum path metric selection mechanism is eliminated. In this embodiment, the decoding depth associated with the trellis defined by the correlation computation mechanism (specifically, first and second neurons) is sufficiently large so that the largest magnitudes of the surviving partial path metrics are selected arbitrarily by the output register selection mechanism from the surviving partial path metrics. In other words, the output register selection mechanism is designed to select any one of the surviving partial path metrics as the largest, since they all will be generally the same magnitude after a predetermined initialization period.

The present invention also provides for a method for high speed decoding of convolutionally-encoded data streams utilizing a neural network and the Viterbi algorithm. The method comprises the following steps: receiving a convolutionally-encoded digital data stream; decoding the digital data stream using an analog neural network having a plurality of neurons for processing a continuous-valued analog input; and decoding the data stream into a sequence of digital values based upon a Viterbi algorithm.

The method provided by the present invention for high speed and efficient decoding of convolutionally-encoded data streams, can be more specifically defined as follows: receiving the convolutionally-encoded data stream; generating branch metrics by passing the data stream through first neurons; providing previous surviving partial path metrics from second neurons; mathematically combining at third neurons the branch metrics from the first neurons and the previous surviving partial path metrics from the second neurons to derive current surviving partial path metrics; comparing at fourth neurons potential surviving partial path metrics output from the third neurons; determining identities at the fourth neurons of current surviving partial path metrics from the comparisons of the potential surviving partial path metrics; determining largest magnitudes of the current surviving partial path metrics; and providing a convolutionally-decoded output data stream having a sequence of digital values corresponding with predetermined states corresponding with the current surviving partial path metrics. Optionally, in practicing the foregoing method, the trellis defined by the first, second, and third neurons may be defined so that the decoding depth $\Gamma$ is sufficiently large so that the largest magnitudes are selected arbitrarily from the current surviving partial path metrics.

In addition to accomplishing all of the aforementioned objects, the present invention has numerous other advantages, a few of which are delineated hereafter.

An advantage of the decoding system of the present invention is that it requires much less space to implement in VLSI technology as compared to prior art embodiments.

Another advantage of the decoding system of the present invention is that it requires much less power to operate than prior art embodiments.

Other objects, features, and advantages of the present invention will become apparent to one with skill in the art upon examination of the following drawings and detailed description. It is intended that all such additional objects, features, and advantages be included herein within this disclosure and within the scope of the present invention.

BRIEF DESCRIPTION OF THE DRAWINGS

The present invention can be better understood with reference to the following drawings. The drawings are not necessarily to scale, emphasis instead being placed upon clearly illustrating the principles of the present invention.

DETAILED DESCRIPTION OF THE PREFERRED EMBODIMENTS

Figure 4:
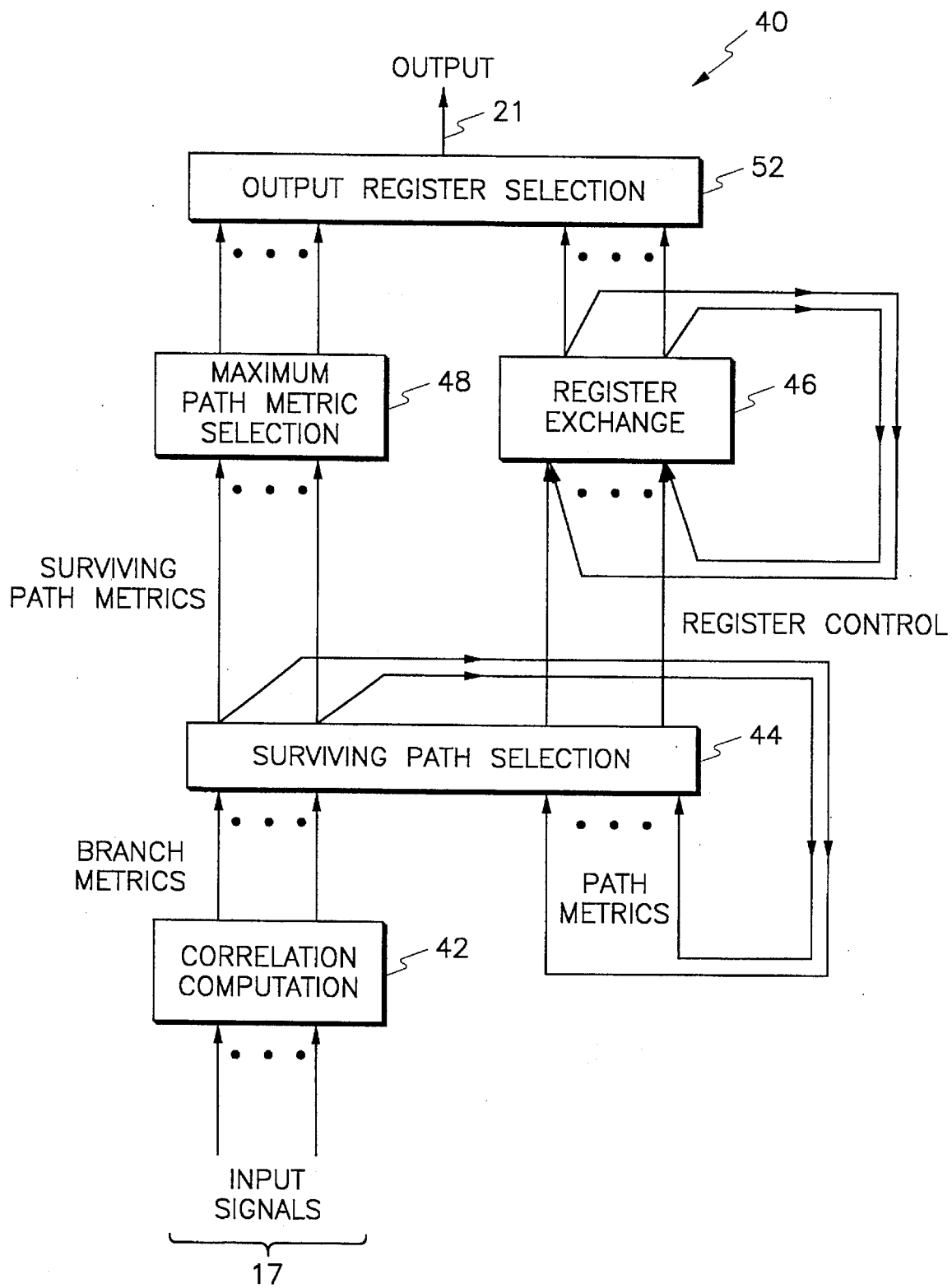
FIG. 4 is a block diagram of a decoding system in accordance with the present invention.

With reference now to the drawings wherein like reference numerals designate corresponding parts throughout the several views, FIG. 4 shows a decoding system 40 with associated methodology in accordance with the present invention. The decoding system 40 decodes a convolutionally-encoded data stream at a much higher speed and more efficiently than any known prior art system by utilizing an artificial neural network (ANN) and the well known Viterbi algorithm.

In general architecture, the ANN decoding system 40 comprises a correlation computation mechanism 42 for receiving the continuous, digital, convolutionally-encoded, input data stream 17. The correlation computation mechanism 42 implements a decoding trellis comprised of analog neurons. These analog neurons can mathematically combine, or sum, continuous-valued analog inputs. The decoding trellis enables generation of branch metrics by correlation of digital values with the received signals. Moreover, previous metrics (surviving partial path metrics, as will be further described hereafter) are mathematically combined with, or summed with, these branch metrics within the trellis.

A surviving path selection mechanism 44, which is in communication with the correlation computation mechanism 42, selects surviving partial path metrics from the trellis at each time increment. The surviving partial path metrics can be identified by determining either the largest or smallest partial path metrics, depending upon the specific design of the system 40. Preferably, the surviving partial path metrics are selected by determining the largest partial path metric.

A register exchange mechanism 46, which is in communication with the surviving path selection mechanism 44, stores and updates the magnitudes of surviving partial path metrics during each time increment. In the register exchange mechanism 46, a shift register is associated with every state in the decoding trellis. The shift register for a given state at a given time contains the information bits associated with the surviving partial path that terminates at that state. As the decoding operations proceed, the contents of the registers are updated and exchanged as dictated by the surviving branches.

A maximum path metric selection mechanism 48, which is in communication with the surviving path selection mechanism 44, determines and identifies the largest of the plurality of surviving partial path metrics at each time increment.

An output register selection mechanism 52, which is in communication with the maximum path metric selection mechanism 48 and with the register exchange mechanism 46, provides a convolutionally-decoded digital output data stream 21 corresponding with the trellis states having the largest of the surviving partial path metrics. At some point during decoding, the output register mechanism 52 begins to output information bits without a significant loss in performance. For example, the output register selection mechanism 52 may be designed so that the information bits associated with a surviving branch at time t can be released when the decoding system 40 begins operation on the branches at time t+Γ. Γ is called the decoding depth of the decoding system 40. It has been shown in the art that the probability of truncation error decreases exponentially with Γ. At low signal-to-noise ratios, the probability of truncation errors is negligible for Γ≧5.8 m, where m is the maximal memory order (the longest shift register in the decoding system). In practice, Γ is usually set to be 5 to 10 times the constraint length K of the code.

The functionality of the foregoing mechanisms will be more specifically described in detail hereinafter. Moreover, it should be noted that each of these mechanisms can be implemented with threshold-limiting (TL) neurons and hard-limiting (HL) neurons, as will be further described relative to FIGS. 6, 7A and 7B hereafter.

Figure 2:
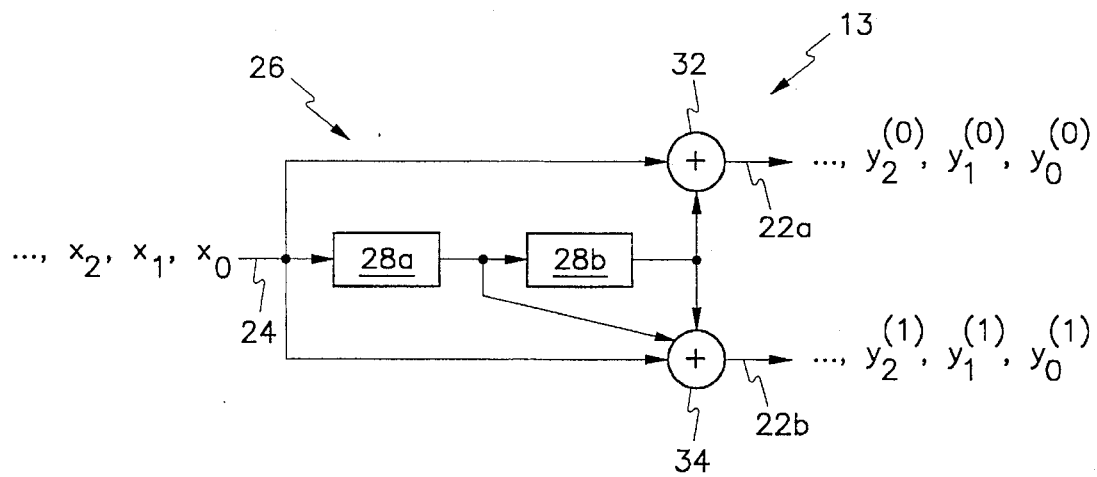
FIG. 2 is a schematic circuit diagram of a conventional convolutional encoding system of FIG. 1 having a rate of ½.
Figure 5A:
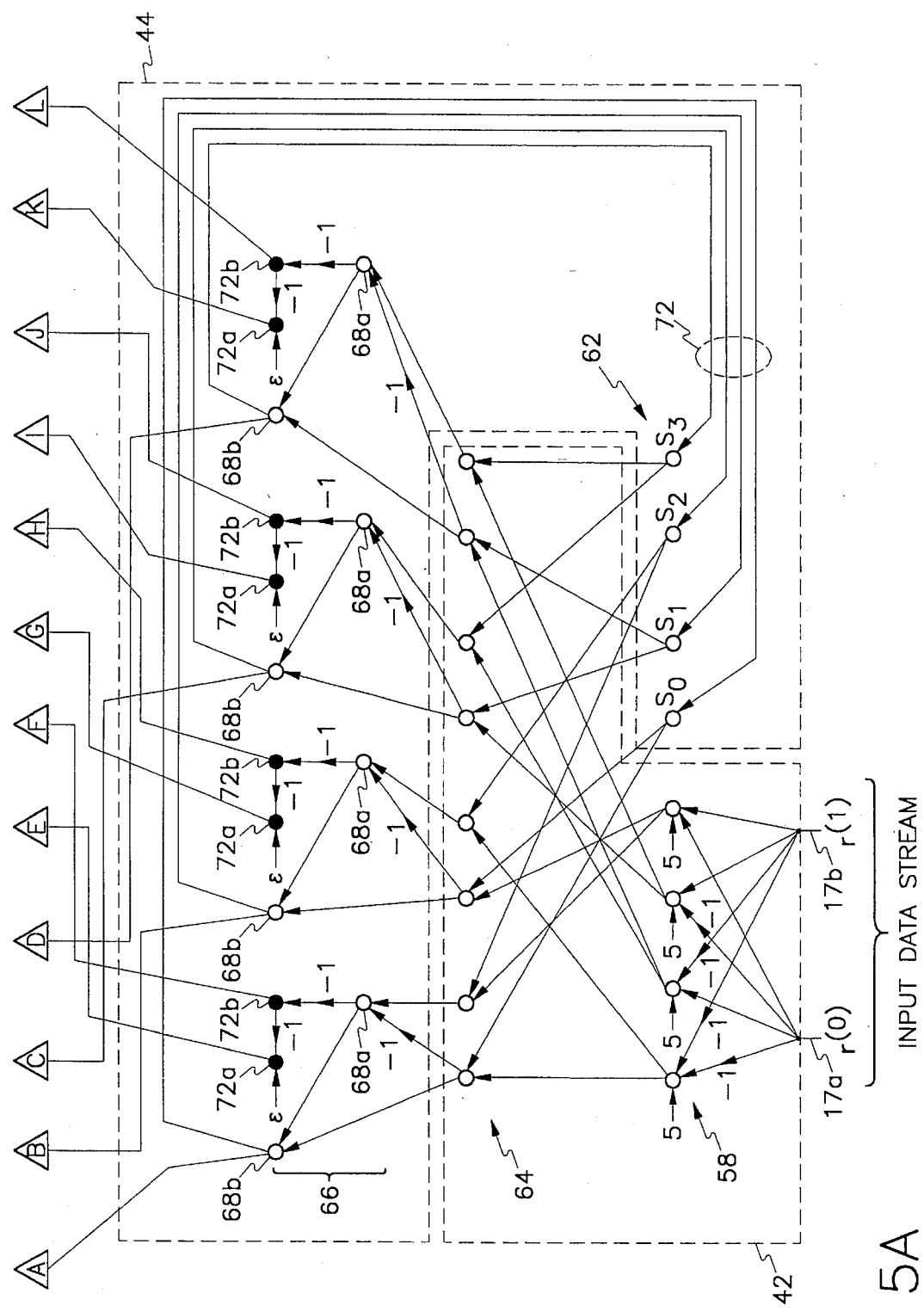
FIG. 5 is a schematic diagram of a first embodiment of the decoding system of FIG. 4.
Figure 5B:
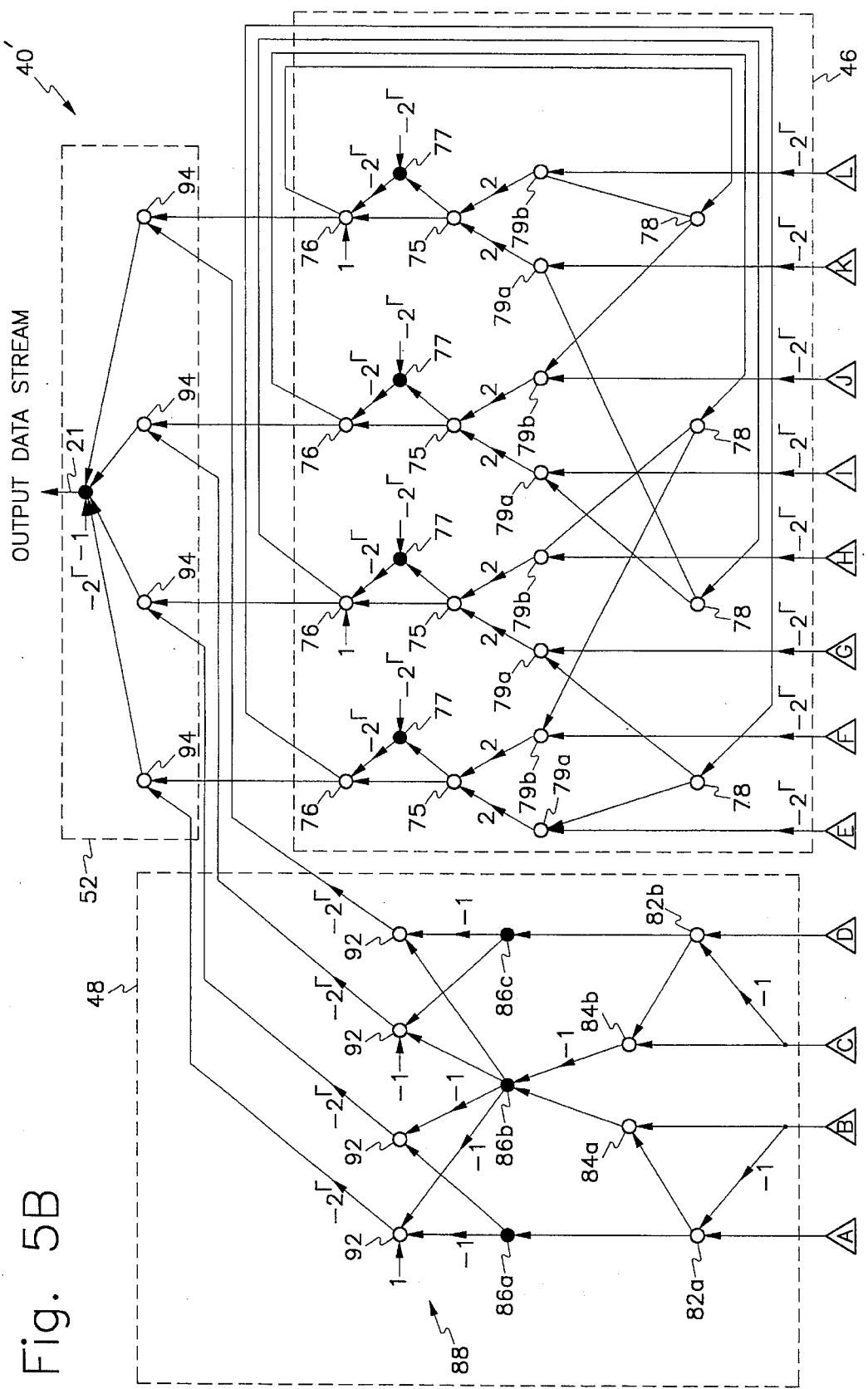

A schematic diagram for a neuralized decoding system 40 of FIG. 4 is illustrated in detail in FIG. 5. The decoding system 40' of FIG. 5 implements the conventional Viterbi algorithm for a rate-½, constraint length K=3, convolutional code. The decoding system 40' is merely an example of numerous decoding systems which can be implemented in accordance with the principles and teachings of the present invention. The decoding system 40' has been selected as an example for decoding the data stream output from the encoding system 13 with rate ½ of FIG. 2. In general, the decoding system 40' can be viewed as an analog representation of a single trellis element. However, the feedback connections 72 in the system 40' expand the decoding operations along the time axis, thereby making the implementation fully parallel.

Figure 6:
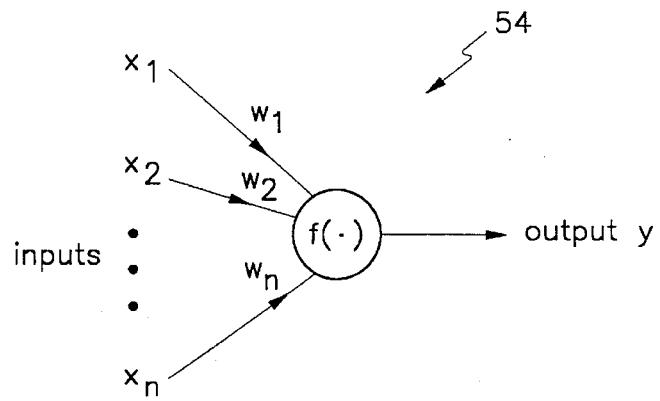
FIG. 6 is a schematic diagram of a neuron in the ANN decoding system of FIG. 5.
Figure 7A:
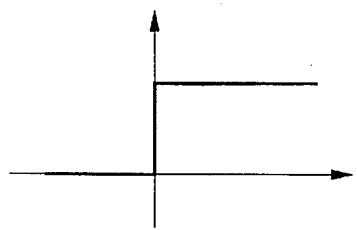
FIG. 7A is a graph of a transfer function for a hard-limiting (HL) neuron of FIG. 5.
Figure 7B:
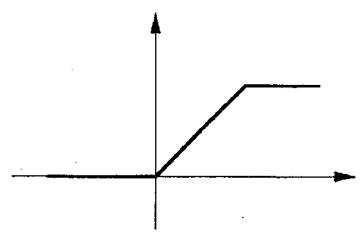
FIG. 7B is a graph of a transfer function for a threshold-logic (TL) neuron of FIG. 5.

The decoding system 40' of FIG. 5 is built entirely from threshold-logic neurons (○) and hard-limiting neurons (●). A general model for a neuron 54 is illustrated in FIG. 6. As shown in FIG. 6, the neuron 54 has multiple inputs $x_1 \ldots x_n$ and a single output y. The input-output relationship can be expressed as follows:

$$y = f\left( \sum_{i=1}^{N} w_i x_i \right),$$

where f is usually a nonlinear function. Typical nonlinearities include the hard-limiting (HL), and the threshold-logic (TL), as are shown in FIGS. 7A and 7B, respectively. The TL neuron operates within its linear range, as shown in FIG. 7B, in the embodiments of the present invention. Furthermore, it should be mentioned that the HL and TL neurons utilized in the present invention are among those that are the most easily implemented in the industry.

Figure 1:
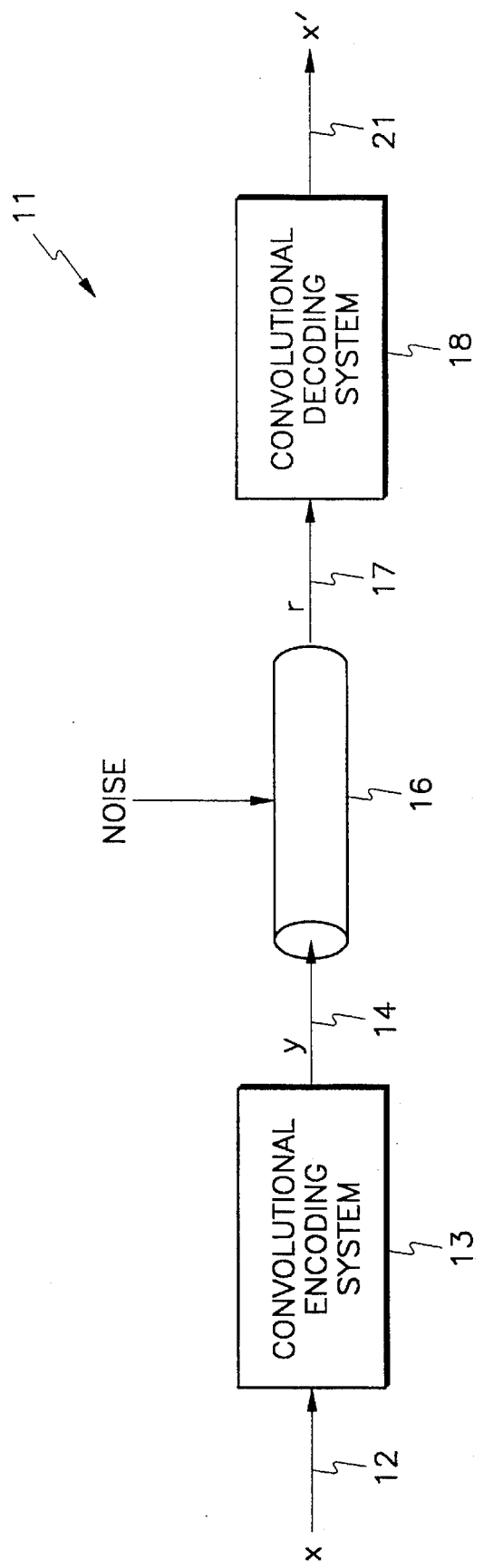
FIG. 1 is a schematic diagram illustrating a communications system which implements conventional convolutional coding for error control.
Figure 3:
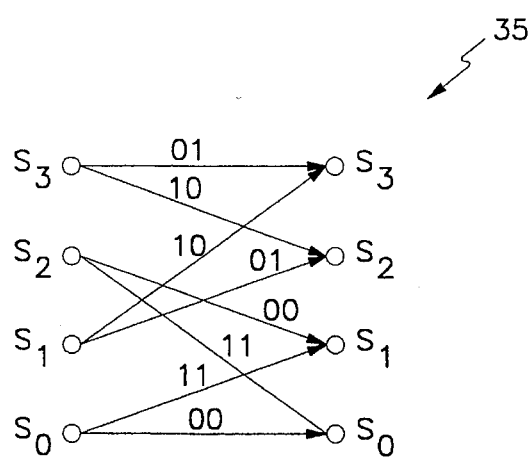
FIG. 3 is a trellis diagram for the convolutional encoding system of FIG. 2 illustrating state transitions of the encoding system over time.

Referring to FIG. 5, the ANN decoding system 40' receives a continuous digital input data stream having successive bits $r^{(0)}, r^{(1)}$, as indicated by reference numerals 17a, 17b. By way of example and for simplification in discussion, the signals $r^{(0)}, r^{(1)}$ are assumed to exhibit signal amplitude values of +1 and −1. The signals are thus random variables with means +1 or −1 over each bit interval. If the communications channel 16 (FIG. 1) is Gaussian, it can be shown that the maximum likelihood branch metrics are the inner products of the received signals and the labels of the corresponding trellis branches, as set forth in FIG. 3. In this regard, see S. Wicker, *Error Control Systems for Digital communication and Storage,* Englewood Cliffs: Prentice Hall, 1994, The four TL neurons 58 at the bottom left corner of FIG. 5 compute these inner products. Since the computation is analog, the quantization error that would have been introduced at this point by a digital decoding system is not a factor. Further, because TL neurons 58 have a zero output when the input is negative, (as is illustrated in FIG. 7A), a bias constant, for instance, +5, is added to each branch metric neuron 58 to ensure that the branch metric is positive in almost all cases. This bias constant offset has no impact on performance.

In the Viterbi algorithm, the partial path metrics for all paths entering the same state are compared and a survivor is declared. In general, there are $2^k$ competing branches entering each state for a rate k/n code, but in this particular example, there are only two branches entering each state $S_i$ ($S_0$, $S_1$, $S_2$, $S_3$, corresponding with each of the neurons 58). In FIG. 5, the output signals of the neurons 58 are the path metrics for the current surviving paths terminating at these respective states.

The branch metrics computed by the neurons 58 are mathematically combined with, or are correlated with, surviving partial path metrics from a previous time increment. The previous surviving partial path metrics are provided by the neurons 62 and the correlation occurs via a series of TL neurons 64 in order to generate a series of current partial path metrics for the states at the current time increment.

Let $i_1$ and $i_2$ be the two states that allow a transition to state $S_i$. Let $P_{i1}$ and $P_{i2}$ be the partial path metrics for the paths terminating at $i_1$ and $i_2$, respectively, and let $b_1$ and $b_2$ denote the metrics for the branches entering $S_i$. TL neurons 64 take the outputs from the neurons 58, 62 and compute the following:

$$p^{(1)} = b_1 + P_{i1}, \; p^{(2)} = b_2 + P_{i2}.$$

A series of four comparison subnets 66 having TL neurons 68a, 68b are connected to the neurons 64 for the purpose of selecting the surviving path at each state $S_0$, $S_1$, $S_2$, $S_3$ and for updating the path metrics via the feedback connections 72. The updating is performed as follows:

$$P_i = \max\{p^{(1)}, p^{(2)}\} = p^{(1)} + \max\{p^{(2)} 31 \; p^{(1)}, 0\}.$$

Figure 8:
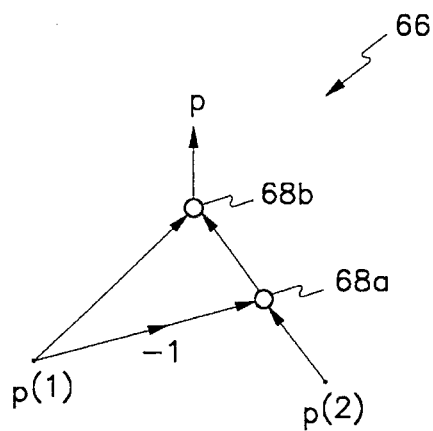
FIG. 8 is a schematic diagram of a comparison subnet in the ANN decoding system of FIG. 5.

Each neural subnet 66 performs an add-compare-select function, as will now be described relative to FIG. 8. The TL neuron 68a computes $p^{(2)} - p^{(1)}$. If this value is positive, the second neuron 68b adds the positive value to $p^{(1)}$, and outputs $P = p^{(2)}$. If the value is negative, then the neuron 68a outputs a zero and the other neuron 68b outputs $p = p^{(1)}$, the nonlinearity f of the TL neurons 68a, 68b can thus be expressed as:ps $$y = f(x) = \max\{x, 0\}.$$

This construction uses one less neuron than a comparator subnet as described in R. P. Lippmann, "An introduction to computing with neural nets,", *IEEE ASSP Magazine,* pages 4–22, April, 1987. Furthermore, the TL neural subnet 66 is better suited for VLSI implementation because the connection weights are either +1 or −1.

The outputs of the comparison subnets 66 of FIG. 5 are essentially the partial path metrics of the surviving paths for the four trellis states $S_0, S_1, S_2, S_3$. The magnitudes of these surviving paths must be sent to the register exchange mechanism 46. The magnitude for each state is determined by utilizing two HL neurons 72a, 72b situated immediately adjacent to each corresponding comparison subnet 66 in FIG. 5. Each pair of HL neurons 72a, 72b is associated with two paths entering a given trellis state. The network is designed so that the output of the HL neuron 72a, 72b associated with the surviving path is zero, while the output of the other HL neuron 72b, 72a is set at one. The HL neuron 72a, 72b associated with non-surviving path provides a $-2\Gamma$ input to the register exchange mechanism 46, while the other HL neuron 72b, 72a, provides a zero input. These values which are output from the neuron 72a, 72b control the register exchange mechanism 46.

In the register exchange mechanism 46, a shift register, constructed from analog neurons, is associated with each state $S_0, S_1, S_2, S_3$ in the decoding trellis. The register for a given state at a given time contains the information bits associated with the surviving partial path that terminates at that state. More specifically, in the register exchange mechanism 46, TL neurons 76, acting as digital registers, store $\Gamma$ bits of information in the form of an output integer in the range [0, i.e., a digital information sequence, $2^{64}-1$]. The most significant bit of the radix-2 representations of these output integers is the oldest bit in the registers 76. The integer values stored in the four register neurons 76 are moved into the register neurons 76 as dictated by the HL neurons 72a, 72b from the surviving path selection mechanism 44.

During the register exchange operation, the values of the register neurons 76 are multiplied by 2 modulo $2^\Gamma$ via neurons 77 before being stored in their new locations. The oldest bit in the register neurons 76 is thus removed and a least significant bit is inserted by a one or zero which is input to the register neurons 76. Note that the value of this bit is fixed by the state associated with the respective register neuron 76.

The maximum path metric selection mechanism 48 comprises two sets of neurons 82a, 82b. These two sets of neurons 82a, 82b collect the current surviving partial path metrics for the four states $S_0, S_1, S_2, S_3$, and start the process of determining which has the maximum value. These two neurons 82, 82b are the input to a hierarchy of choose-maximum-of-the-2 neurons 84a, 84b, which are followed by a layer of HL neurons 86a, 86b, 86c that indicate the positions of the winning state (one of $S_0, S_1, S_2, S_3$). Further, an output layer 88 of TL neurons 92 decodes the outputs from the HL neurons 86 so that the output layer neuron associated with the state with the maximum path metric will have output 0, while the rest will have output 1.

The output register selection mechanism 52 comprises four register selection neurons 94 corresponding respectively with the four register neurons 76 for receiving the surviving partial path metrics therefrom. Essentially, during each time increment, the output register selection mechanism 52 selects the largest surviving partial path metric stored in the neurons 94 (as well as neurons 76) and outputs same on line 21. The identity of the largest surviving partial path metric is provided to the mechanism 52 by the maximum path metric selection mechanism 48. In other words, the maximum path metric selection mechanism 48 tells the mechanism 52 which neuron 94 to select.

Moreover, the value provided by the appropriate neuron 94 is added to a corresponding integer of $-2^{(\Gamma-1)}$ via an HL neuron 96. The HL neuron 96 at the output of the ANN decoding system 40' has a zero output if the most significant bit of the selected register output (i.e., the oldest data bit in the selected register 76) is 0, and a 1 output if the most significant bit is 1. The output 21 is the decoded data bit for the current time increment.

The system 40' of FIG. 5 shows that the Viterbi algorithm can be implemented solely through the use of analog neurons. However, the efficiency of the implementation can be further improved and further simplified as will be described hereafter.

The neural network implementation of the system 40' requires that the TL register neurons 76 have a precision of at least $\Gamma$ bits, or equivalently have a dynamic range of at least $20 \log_{10} 2^\Gamma = 6\Gamma(dB)$. The decoding depth $\Gamma$ is usually about 5 to 10 times the constraint length K, where a value of K=7 is typical. Therefore, the decoding depth $\Gamma$ can easily run into the neighborhood of 100, and the required dynamic range exceeds what current technology can achieve. There are two ways to get around this problem.

An analog solution is obtained by allocating the $\Gamma$ bits represented by the output of each register neuron 76 among several neurons. The neurons 76 forming a register are connected so that an input and a shift of the lowest order neuron causes subsequent inputs and shifts of the higher order neurons. Given a j-neuron register, the required dynamic range for each neuron is $6\Gamma/j$ (dB).

ANALOG/DIGITAL HYBRID DECODING SYSTEM

Figure 9:
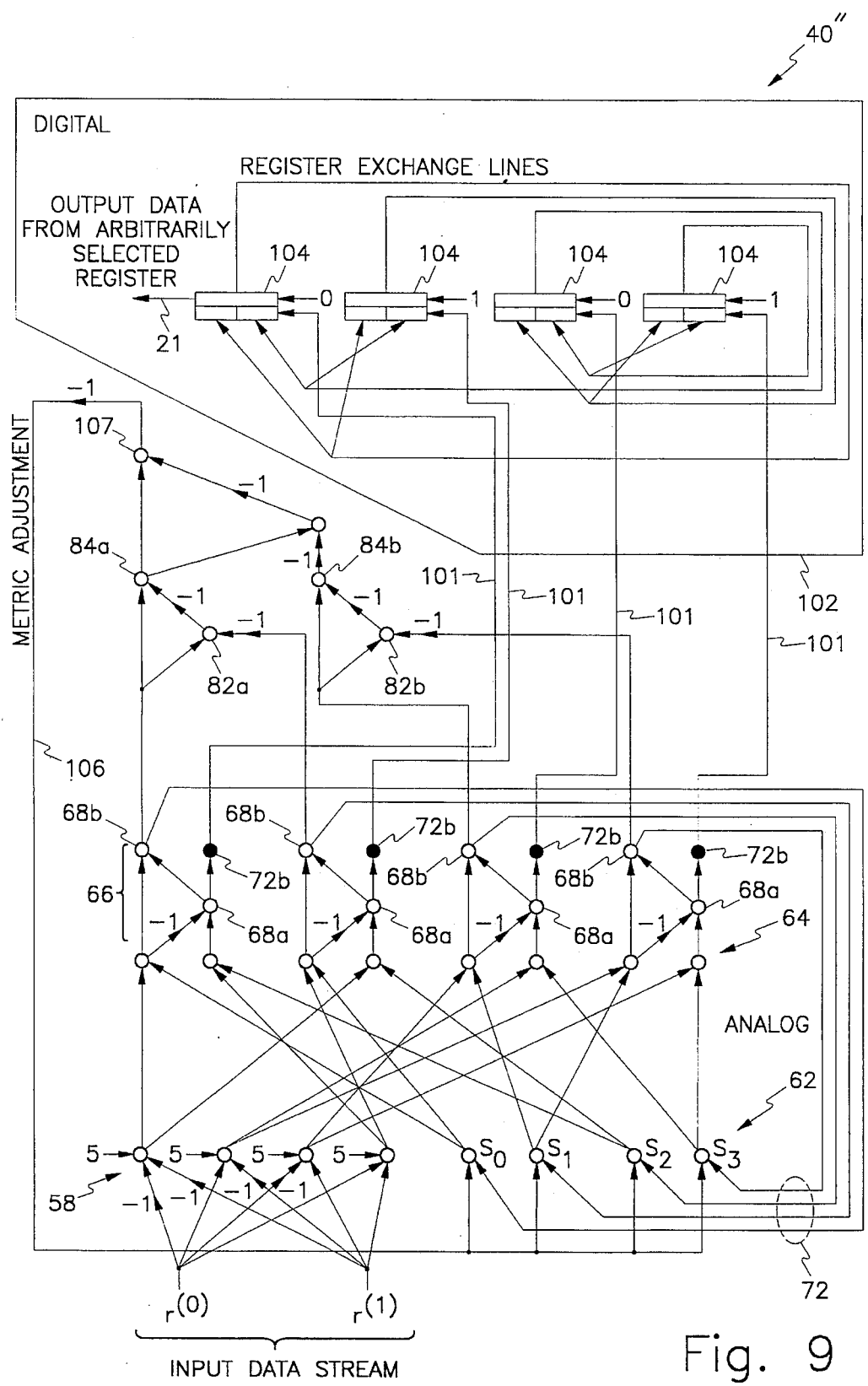
FIG. 9 is a schematic diagram of a second embodiment of an ANN decoding system of FIG. 4 having a digital mechanism for storing and updating an information sequence.

Another alternative is to adopt an analog/digital hybrid design. The operations in the register exchange mechanism 46 are digital in essence, and accordingly, a digital realization is a good choice. An analog/digital hybrid decoding system 40" of the present invention is illustrated in FIG. 9. As shown in FIG. 9, the register exchange mechanism 46 and the output register selection mechanism 52 are implemented by a totally digital mechanism 102. The digital mechanism 102 comprises a plurality of registers 104. Each register 104 is a $\Gamma$ bit shift register with 2-select-1 $\Gamma$ bit inputs. Further the output 21 from the decoding system 40" is generated by shifting out data from the registers 104.

SURVIVING PATH METRIC ADJUSTMENT

As previously described, in the preferred embodiment, the path metric for the surviving path from any neuron 64 is obtained by taking the maximum among all metrics of those paths which converge at the neuron 64. The path metric of the survivor thus accumulates as time evolves. Because the TL neurons 64 have finite dynamic range, they might eventually saturate. It is also possible that the branch metrics may become so small relative to the path metrics of the surviving paths that the branch metrics make no contribution during the update of the path metric. Either situation causes the decoding system 40 to fail catastrophically.

The foregoing problem can be readily remedied by observing that the differences between the metrics for the surviving paths do not grow as quickly as the absolute values. In fact, the differences between these metrics are bounded, because the surviving paths merge at some distance back in the trellis. In this regard, see A. P. Hextra, "An alternative to metric rescaling in Viterbi decoders," *IEEE*

*Transactions on Communications,* COM-37, pages 1220–1222, November, 1989. It follows that a mechanism which periodically "drags down" the path metrics for the survivors will solve the range problem without adversely affecting performance. At the same time, a little caution should be exerted to keep the metrics positive in order to maintain the proper performance of the TL neurons 64.

One way of implementing the metric reduction is through the addition of a MINNET (short for, minimization network), which is similar to the maximum path metric selection mechanism 48, but picks the minimum value among the path metrics. This minimum value is fed back with weight −1 and combined with the path metrics of the surviving paths. Accordingly, the minimum updated path metric is always kept at zero and the maximum value is bounded. Worth noting is that in the system 40" of FIG. 9, a MINNET would actually be simpler than the net for the maximum path metric selection mechanism 48, because only the minimum metric, not its location, is needed.

There is also a much simpler, yet equally effective alternative configuration for a MINNET. A threshold is set (for example, 10 times the typical branch metric) and a state is arbitrarily chosen. The path metric for this state is sampled periodically. When the path metric at that state exceeds the threshold, the amount of the difference is subtracted from all path metrics, and thus the path metric at the chosen state is forced to remain around the threshold. This alternative configuration requires the addition of only one more neuron (reference numeral 107) to the original system 40' and is the design implemented in FIG. 9.

As shown in FIG. 9, the MINNET comprises a metric adjustment line 106 and a subnet of neurons 82a, 82b, 84a, 84b, 107. The neurons 82a, 82b, 84a, 84b, 107 determine which of the states $S_0, S_1, S_2, S_3$ is the largest. The TL neuron 107 outputs the largest magnitude of the states $S_0, S_1, S_2, S_3$. Via a metric adjustment line 106, the largest magnitude is modified by a weight of −1 for error margin and is communicated to the surviving path metrics at neurons 62 corresponding with each of the states $S_0, S_1, S_2, S_3$.

ELIMINATION OF MAXIMUM PATH METRIC SELECTION MECHANISM

The maximum path metric selection mechanism 48 is used to select and identify the register neuron 76 in the register exchange mechanism 46 associated with the state $S_0, S_1, S_2, S_3$ that has the largest surviving partial path metric. The larger the decoding depth, however, the less useful this mechanism 48 becomes. As all surviving paths are traced back through the trellis, a point is reached beyond which the paths coincide, as is described in S. Wicker, *Error Control Systems for Digital Communication and Storage,* Englewood Cliffs: Prentice Hall, 1994. If this point is within the decoding depth, it does not matter which surviving path is selected. Thus, if the decoding depth associated with the trellis defined by the neurons 58, 64 is sufficiently large, then the output register selection mechanism 52 can arbitrarily select any one of the surviving partial path metrics in registers 76 as the largest, because they all will be nearly the same.

In the systems 40', 40", the feedback loops 72 enable development and use of a trellis which is larger than a single stage, while using hardware for only a single stage. In a sense, the decoding trellis is expanded along the time axis. As a result, after a sufficient initialization period, the decoding depth associated with the trellis is of sufficient size so that the output register selection mechanism 52 can arbitrarily select any one of the surviving partial path metrics in registers 76 as the largest. Hence, the maximum path metric selection mechanism 48 can be eliminated without affecting performance, while substantially simplifying the decoding systems 40', 40".

COMPLEXITY

The complexity of a neural network is characterized by the number of neurons and the number of connections between these neurons. For networks of N neurons, the fully connected network has $N(N-1)/2$ connections. So for fully or nearly fully connected networks, the number of connections dominates the complexity. For a locally connected network, each of whose neurons has only limited connections to other neurons, the total number of connections is linearly bounded with N. N alone can thus be used to characterize the complexity of a locally connected network. From FIG. 4 and FIG. 8, it can be seen that the decoding system 40 is locally connected. In this section, the number of neurons required for a generalized version of the hybrid decoding system 40" in FIG. 8 is determined.

Let a convolutional encoding system generate an n-bit output block for every k-bit input block. Such a code is said to have rate r=k/n. Each branch in the decoding trellis is labeled with an n-bit output block, so there are $2^n$ possible branch metrics, and $2^n$ TL neurons are needed for input correlation. Let M be the total number of memory elements in the encoding system. $2^M$ TL neurons are required to store the path metrics for the 2M states. For each state at each time increment, a surviving path is selected from the $2^k$ TL neurons are needed to represent the metrics for these paths. k layers of comparison subnets (see FIG. 7) are used to find the maximum among $2^k$ path metrics. The bottom layer has $2^{(k-1)}$ subnets, the next layer as $2^{(k-2)}$ subnets and so on for a total of $2^k-1$ comparison subnets in the k layers. This amount to $2(2^k-1)$ TL neurons. Each comparison subnet 66 uses an HL neuron to indicate the results of the comparison, so there are $2^k-1$ HL neurons for each state. The total number of neurons involved in surviving path selection is $1^M[2^k+2(2^k-1)]$ TL neurons and $2^M(b\ 2^k-1)$ HL neurons, Similarly there are $2(b\ 2^M-1)$ TL neurons in MINNET. These results are summarized in Table A.

TABLE A

| Distribution Of Neurons In Decoding System | | |
|---|---|---|
| | Number of TL Neurons | Number of HL neurons |
| Input correlation | $2^n$ | |
| Path metric feedback | $2^M$ | |
| Surviving path selection | $2^{M+k} + 2^M 2(2^k - 1)$ | $2^M(2^k - 1)$ |
| MINNET | $2(2^M - 1)$ | |

From Table A, the total number of neurons N can be computed and N = $2^{M+k+2} + 2^n - 2$.
If the MINNET modification is not used, the total number of neurons is N' = $N - 2(2^M - 1) + 1 = 2^{M+1} + 2^n - 3$.

For a numerical example, consider a rate-½0 code with constraint length K=7(M=K−1=6). The above equations provide N=500 and N'=381. Clearly the ANN implementation does not require an inordinate number of neurons. Both types of neurons in the decoding system can be realized using standard operational amplifiers (Op-Amps). If each Op-Amp contains 20 transistors, the hybrid decoding system 40" with MINNET of FIG. 9 will have approximately 10,000 transistors, while the hybrid decoding system 40"

without MINNET will have less than 8,000 transistors. On the other hand, a fully digital implementation of a Viterbi decoding system for the same code requires 50,000 transistors just for the ACS operations. In this regard, see J. Sparso et al., "An area-efficient topology for VLSI Viterbi decoders and other shuffle-exchange type structures," *IEEE Journal of Solid-State Circuits*, Vol. 26., No. 2, pp. 90–97, Feb. 1991. The complexity advantage enjoyed by the ANN Viterbi decoding system over digital decoding systems is clear.

SIMULATION RESULTS AND CONCLUSION

Figure 10:
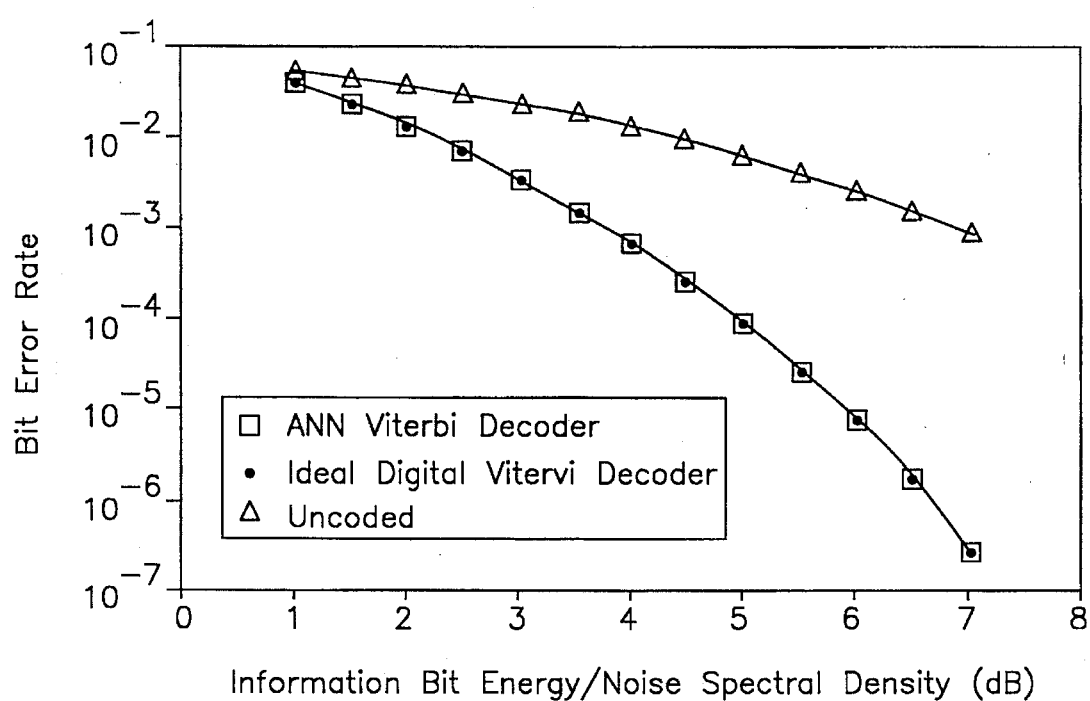
FIG. 10 is a graph illustrating simulation results of the decoding system of FIG. 4.

FIG. 10 shows the simulation results for the decoding system 40 and an ideal decoding system. The performance of the decoding system 40 of the present invention exactly matches that of the ideal decoding system. This is as expected since the decoding system 40 of the present invention is a "neuralized" version of the Viterbi algorithm that does not quantize input signals.

The following are some advantages of the decoding system 40. First, the decoding system 40 implements the Viterbi algorithm using analog, artificial neurons. The performance exceeds that of any conventional Viterbi decoding system that uses an analog-to-digital (A/D) converter with finite resolution (though the difference becomes small when the number of bits of resolution in the A/D converter exceeds 3). Second, the operations of the decoding system 40 are fully parallel, and the structure does not place any limit on the speed. With state-of-the-art components or VLSI implementation, a very high speed Viterbi decoding system can be constructed. Third, the complexity of the decoding system 40 can be fully determined by the parameters of the convolutional code. A decoding system for the industry standard (K=7) convolutional code can be easily placed on a single chip. Fourth, the distribution of the connection weights determines the network complexity from the VLSI implementation point of view. The weights of most of the connections in the fully analog decoding system and all of the connections in the hybrid decoding system are either +1 or −1, which basically eliminates the weight considerations in implementation. Fifth, the network of the system 40 is only locally connected so that any VLSI layout will be simple and fan-in and fan-out considerations are minimal. Sixth, the characteristics of the TL and HL neurons are very simple to implement using the existing linear circuits and nonlinear components. Seventh, the decoding system 40 thus provides a substantial improvement in decoding system technology over traditional digital designs. Further research in this area is expected to develop other benefits provided by the ANN design. These include the development of intelligent decoding systems that can monitor the channel and use side information in the form of neuron activation patters and output levels to optimize decoding system performance for nonstationary channels. It is also expected that the ANN decoding system will provide a natural means for providing optimally defined erasures when concatenated with REED-Solomon decoding systems (as called for in NASA's deep space data communication standard.

It will be obvious to those skilled in the art that many modifications and variations may be made to the embodiments described above without substantially departing from the principles of the present invention. It is intended that all such modifications and variations be included herein within the scope of the present invention, as set forth in the following claims.

Wherefore, the following is claimed:

1. A maximum likelihood decoding system for high speed and efficient decoding of convolutionally-encoded data streams of constraint lengths greater than 6, comprising an analog neural network having a plurality of analog neurons, said analog neurons for mathematically combining analog signals, said analog neural network adapted to receive a convolutionally-encoded digital data stream and adapted to decode said data stream using said analog neurons into a sequence of digital values by performing a Viterbi algorithm, said analog network minimizing error in said digital values.

2. The system of claim 1, wherein said analog neural network comprises an analog means for determining a maximum likelihood code word corresponding with said digital data stream based upon path metrics associated with paths in said analog neural network.

3. The system of claim 1, further comprising a digital means connected to said analog neural network, said digital means for storing a digital information sequence and for updating said information sequence.

4. The system of claim 1, further comprising an analog means connected to said analog neural network, said analog means for storing a digital information sequence and for updating said information sequence.

5. The system of claim 1, further comprising a means for identifying a minimum path metric among various states and for reducing path metrics by a proportional amount.

6. The system of claim 1, further comprising a digital shift register using analog neurons.

7. The system of claim 1, further comprising a branch metric computer for processing analog metric values associated with neurons in said analog neural network.

8. The system of claim 1 situated within an integrated circuit.

9. The system of claim 1, wherein said plurality of analog neurons include threshold-limiting neurons and hard-limiting neurons.

10. A decoding system for high speed and efficient decoding of convolutionally-encoded data streams utilizing an artificial neural network and the Viterbi algorithm, comprising:

(a) a correlation computation means having first and second neurons, said first and second neurons being adapted to mathematically combine analog signals, said first neurons for receiving said convolutionally-encoded data stream and for generating branch metrics, said second neurons for mathematically combining said branch metrics from said first neurons with previous partial path metrics to derive current partial path metrics;

(b) a surviving path selection means in communication with said correlation computation means, said surviving path selection means having third and fourth neurons, said third neurons for identifying surviving partial path metrics, said fourth neurons for providing said surviving partial path metrics to said second neurons, said surviving partial path metrics being used by said second neurons as previous partial path metrics during a subsequent time increment;

(c) a maximum path metric selection means in communication with said surviving path selection means, said maximum path metric selection means for determining identities of largest surviving partial path metrics;

(d) a register exchange means in communication with said surviving path selection means, said register exchange means for storing and updating the magnitudes of surviving partial path metrics; and (e) an output register selection means in communication with said maximum path metric selection means and said register exchange means, said output register selection means for providing a convolutionally-decoded output data stream with digital values corresponding with said surviving partial path metrics.

11. The system of claim 10, wherein said register exchange means comprises a digital means for storing a digital information sequence and for updating said information sequence.

12. The system of claim 10, wherein said register exchange means comprises an analog means for storing a digital information sequence and for updating said information sequence.

13. The system of claim 10, further comprising a means in communication with said second and fourth neurons, said means for identifying a minimum partial path metric output from said fourth neurons and for reducing partial path metrics by an amount corresponding with said minimum partial path metric at said second neurons.

14. The system of claim 10 wherein said output register selection means comprises a digital shift register comprising analog neurons.

15. The system of claim 10 implemented within an integrated circuit.

16. A decoding system for high speed and efficient decoding of convolutionally-encoded data streams utilizing an artificial neural network and the Viterbi algorithm, comprising:

(a) a correlation computation means having first and second neurons, said first neurons for receiving said convolutionally-encoded data stream and for generating branch metrics, said second neurons for mathematically combining said branch metrics from said first neurons with previous partial path metrics to derive current partial path metrics;

(b) a surviving path selection means in communication with said correlation computation means, said surviving path selection means having third and fourth neurons, said third neurons for identifying surviving partial path metrics, said fourth neurons for providing said surviving partial path metrics to said second neurons, said surviving partial path metrics being used by said second neurons as previous partial path metrics during a subsequent time increment;

(c) a register exchange means in communication with said surviving path selection means, said register exchange means for storing and updating magnitudes of said surviving partial path metrics;

(d) an output register selection means in communication with said register exchange means, said output register selection means for providing a convolutionally-decoded output data stream with digital values corresponding with said surviving partial path metrics; and wherein a decoding depth associated with a trellis defined by said first, second, and third neurons is sufficiently large so that a magnitude of any one of said surviving partial path metrics output from said register exchange means is selected for output by said output register selection means.

17. A method for high speed and efficient decoding of convolutionally-encoded data streams with maximum likelihood using the Viterbi algorithm, comprising steps of:

receiving a convolutionally-encoded digital data stream of constraint lengths greater than 6; and decoding said data stream into a sequence of digital values using an analog neural network having a plurality of analog neurons and the Viterbi algorithm, thereby minimizing error in said digital values.

18. A method for high speed and efficient decoding of convolutionally-encoded data streams utilizing a neural network and the Viterbi algorithm, comprising:

receiving the convolutionally-encoded data stream;

generating branch metrics by passing said data stream through first neurons:

mathematically combining at third neurons said branch metrics from said first neurons and said previous surviving partial path metrics from said second neurons;

comparing at fourth neurons potential surviving partial path metrics output from said third neurons;

determining identities at said fourth neurons of current surviving partial path metrics from said comparisons of said potential surviving partial path metrics;

determining largest magnitudes of said current surviving partial path metrics; and providing a convolutionally-decoded output data stream having a sequence of digital values corresponding with predetermined states corresponding with said current surviving partial path metrics, thereby minimizing error in said digital values.

19. The method of claim 18, further comprising the step of using a trellis defined by said first, second, and third neurons having a decoding depth which is sufficiently large so that said largest magnitudes are selected arbitrarily from said current surviving partial path metrics.

* * * * *